(12) United States Patent
Choi et al.

(10) Patent No.: US 7,405,965 B2
(45) Date of Patent: Jul. 29, 2008

(54) PHASE CHANGE MEMORY DEVICE

(75) Inventors: Byung-gil Choi, Yongin-si (KR);
Du-eung Kim, Yongin-si (KR);
Woo-yeong Cho, Suwon-si (KR)

(73) Assignee: Samsung Electronics Co., Ltd.,
Suwon-si, Gyeonggi-do (KR)

( * ) Notice: Subject to any disclaimer, the term of this patent is extended or adjusted under 35 U.S.C. 154(b) by 23 days.

(21) Appl. No.: 11/648,558

(22) Filed: Jan. 3, 2007

(65) Prior Publication Data
US 2007/0159878 A1 Jul. 12, 2007

(30) Foreign Application Priority Data
Jan. 11, 2006 (KR) .................. 10-2006-0003272

(51) Int. Cl.
*G11C 11/22* (2006.01)

(52) U.S. Cl. .................. 365/163; 365/63; 365/148

(58) Field of Classification Search .................. 365/163
See application file for complete search history.

(56) References Cited

U.S. PATENT DOCUMENTS

| | | | | |
|---|---|---|---|---|
| 5,495,440 A | * | 2/1996 | Asakura | ................ 365/149 |
| 5,973,983 A | * | 10/1999 | Hidaka | ............... 365/230.03 |
| 6,115,288 A | * | 9/2000 | Amanai et al. | ......... 365/185.17 |
| 6,873,007 B2 | * | 3/2005 | Sugita et al. | ................. 257/321 |
| 6,891,748 B2 | * | 5/2005 | Tsuchida et al. | ............ 365/158 |
| 6,937,505 B2 | * | 8/2005 | Morikawa | .................... 365/158 |
| 6,956,779 B2 | * | 10/2005 | Tran | ........................... 365/205 |

FOREIGN PATENT DOCUMENTS

| | | |
|---|---|---|
| KR | 1020020094355 A | 12/2002 |
| KR | 1020040049288 A | 6/2004 |
| KR | 1020050067472 A | 7/2005 |
| WO | WO 03/009302 A1 | 1/2003 |

* cited by examiner

*Primary Examiner*—Tan T. Nguyen
(74) *Attorney, Agent, or Firm*—Volentine & Whitt, PLLC

(57) ABSTRACT

A phase change memory device includes a semiconductor substrate which includes a plurality of phase change memory cells, a plurality of local bit lines extending over the semiconductor substrate, each of the plurality of local bit lines being coupled to the plurality of phase change memory cells, and a plurality of global bit lines extending over the plurality of local bit lines, each of the plurality of global bit lines being selectively coupled to the plurality of local bit lines. The plurality of global bit lines are located at two or more different wiring line levels over the semiconductor substrate.

17 Claims, 9 Drawing Sheets

PHASE CHANGE MEMORY DEVICE

BACKGROUND OF THE INVENTION

1. Field of the Invention

The present disclosure relates generally to memory devices and, more particularly, the present invention relates to phase change memory devices.

A claim of priority is made to Korean Patent Application No. 10-2006-003272, filed on Jan. 11, 2006, in the Korean Intellectual Property Office, the disclosure of which is incorporated herein by reference in its entirety.

2. Description of the Related Art

Phase change random access memory devices (PRAM) store data using a phase change material, such as, for example, a chalcogenide alloy, that transforms into a crystalline state or an amorphous state during cooling after heat treatment. Each state of the phase change material has different resistance characteristics. Specifically, the phase change material in the crystalline state has low resistance and the phase change material in the amorphous state has high resistance. The crystalline state is typically referred to as a "set state" having a logic level "0", and the amorphous state is typically referred to as a "reset state" having a logic level "1".

In the phase change memory devices, data is written using Joule heat. This Joule heat is generated when a write current is supplied to the phase change material having a predetermined resistance. Specifically, the phase change material is heated to at least a melting temperature of the material and then rapidly cooled, so that the phase change material transforms into the amorphous state. Alternatively, the phase change material is heated to temperature that is higher than a crystallization temperature but less than the melting temperature, kept at the temperature for a predetermined time, and then cooled. By this process, the phase change material transforms into the crystalline state.

Furthermore, in order to provide high capacity and high integration in the phase change memory devices, the phase change memory devices can be implemented by a hierarchical bit line structure using global bit lines and local bit lines. In this case, there may be a difference in length between phase change memory cells that are coupled to local bit lines distant from a wiring circuit and/or a reading circuit and phase change memory cells coupled to local bit lines close to the writing circuit and/or the reading circuit. This difference in length may affect the operation of the phase change memory device. That is, because resistance exists on the individual global bit lines, resistance from the writing circuit and/or the reading circuit to the selected phase change memory cell may not be uniform. Instead, the resistance may vary according to the position of the selected phase change memory cell with respect to the writing circuit and/or the reading circuit. Thus, a difference in resistance depends on a physical distance between the cell and the writing/reading circuit.

These differences in resistance between phase change memory cells and reading/writing circuits may lead to undesirable consequences. In particular, as described above, the phase change memory devices write data using the write current. This write current may be sensitive to the difference in resistance. Accordingly, a write current to be applied to the phase change memory cells that are coupled to the local bit lines distant from the writing circuit and/or the reading circuit may be smaller than a write current to be applied to the phase change memory cells that are coupled to the local bit lines close to the writing circuit and/or the reading circuit. This difference in write current may lead to errors in the programming operations of phase change memory devices.

SUMMARY OF THE INVENTION

In one aspect of the present disclosure, a phase change memory device is provided which includes a semiconductor substrate which includes a plurality of phase change memory cells, a plurality of local bit lines extending over the semiconductor substrate, each of the plurality of local bit lines being coupled to the plurality of phase change memory cells, and a plurality of global bit lines extending over the plurality of local bit lines, each of the plurality of global bit lines being selectively coupled to the plurality of local bit lines. The plurality of global bit lines are located at two or more different wiring line levels over the semiconductor substrate.

In another aspect of the present disclosure, a phase change memory device is provided which includes a semiconductor substrate including a plurality of phase change memory block regions and a plurality of column selection regions, a plurality of phase change memory cells formed in each of the plurality of phase change memory block regions, a plurality of local bit lines extending over the plurality of phase change memory block regions, each of the plurality of local bit lines being coupled to the plurality of phase change memory cells, adjacent first and second global bit lines extending in a direction to cross over the plurality of phase change memory block regions, and a plurality of column selection transistors formed on each of the plurality of column selection regions, each of the plurality of column selection transistors coupled between each of the plurality of local bit lines and the first or second global bit line. The first and second global bit lines are located at different wiring line levels over the semiconductor substrate.

In yet another aspect of the present disclosure, a phase change memory device is provided which includes a semiconductor substrate including a plurality of phase change memory block regions and a plurality of column selection regions, a plurality of phase change memory cells formed in each of the plurality of phase change memory block regions, a plurality of local bit lines extending over the plurality of phase change memory block regions, each of the plurality of local bit lines being coupled to the plurality of phase change memory cells, a plurality of global bit lines including a first and second global bit line extending in a direction to cross over the plurality of phase change memory block regions, and a plurality of column selection transistors formed in each of the plurality of column selection regions, each of the plurality of column selection transistors being coupled between each of the plurality of local bit lines and the first or second global bit line. Each of the plurality of global bit lines is formed of a plurality of metal wiring lines that are formed at two or more wiring line levels and are coupled to each other.

BRIEF DESCRIPTION OF THE DRAWINGS

The above and other features of the present disclosure will become readily apparent from the detailed description that follows, with reference to the accompanying drawings, in which.

DETAILED DESCRIPTION

Figure 1:
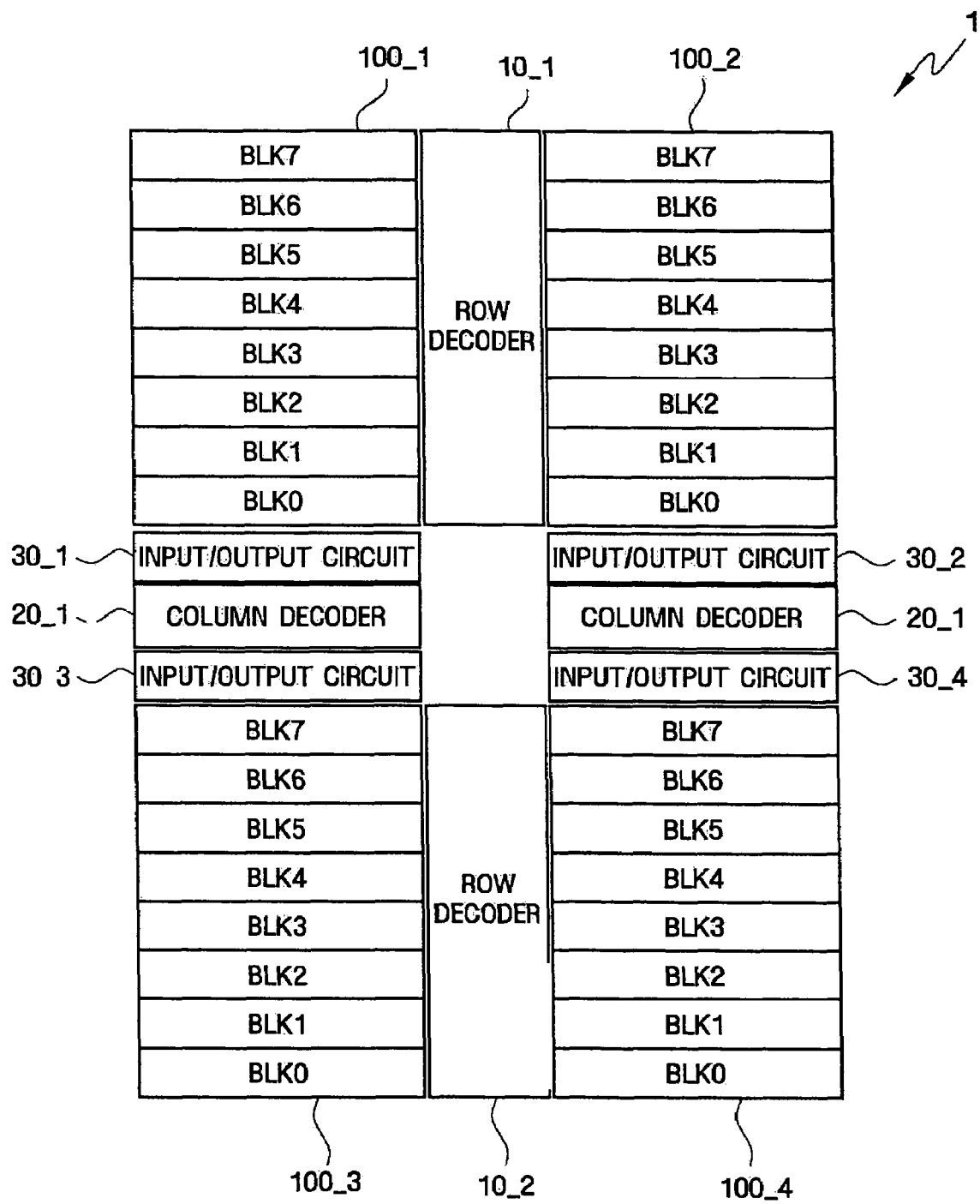
FIG. 1 and FIG. 2 are a block diagram and a circuit diagram, respectively, illustrating a phase change memory device according to an exemplary disclosed embodiment.

Features of the present invention and methods of accomplishing the same may be understood more readily by reference to the following detailed description of exemplary embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Like reference numerals refer to like elements throughout the specification.

FIG. 1 is a block diagram illustrating a phase change memory device according to an exemplary embodiment. In FIG. 1, four memory banks are illustrated for convenience of explanation, but the present disclosure is not limited to this configuration.

Referring to FIG. 1, a phase change memory device 1 includes memory banks 100_1, 100_2, 100_3, and 100_4, row decoders 10_1 and 10_2, column decoders 20_1 and 20_2, and input/output circuits 30_1, 30_2, 30_3, and 30_4.

Each of the memory banks 100_1, 100_2, 100_3, and 100_4 includes a plurality of phase change memory cells arranged in a matrix shape. Furthermore, each of the memory banks 100_1, 100_2, 100_3, and 100_4 has a plurality of memory blocks BLKi (where i=0 to 7). In addition, while an exemplary embodiment includes eight memory blocks BLKi (where i=0 to 7) the present disclosure is not limited to this configuration.

The row decoder 10_1 or 10_2 is arranged to correspond to two memory banks 100_1 and 100_2 or 100_3 and 100_4 so as to assign row addresses in the memory banks 100_1, 100_2, 100_3, and 100_4. For example, the row decoder 10_1 can select the row addresses of the first and second memory banks 100_1 and 100_2.

The column decoder 20_1 or 20_2 is arranged to correspond to two memory banks 100_1 and 100_3 or 100_2 and 100_4 so as to assign column addresses in the memory banks 100_1, 100_2, 100_3, and 100_4. For example, the column decoder 20_1 can select the column addresses of the first and third memory banks 100_1 and 100_3.

The input/output circuits 30_1, 30_2, 30_3, and 30_4 are arranged to correspond to the memory banks 100_1, 100_2, 100_3, and 100_4 so as to perform a writing operation and/or a reading operation in the memory banks 100_1, 100_2, 100_3, and 100_4. That is, though not shown, each of the input/output circuits 30_1, 30_2, 30_3, and 30_4 can include a writing circuit and/or a reading circuit.

Figure 2:
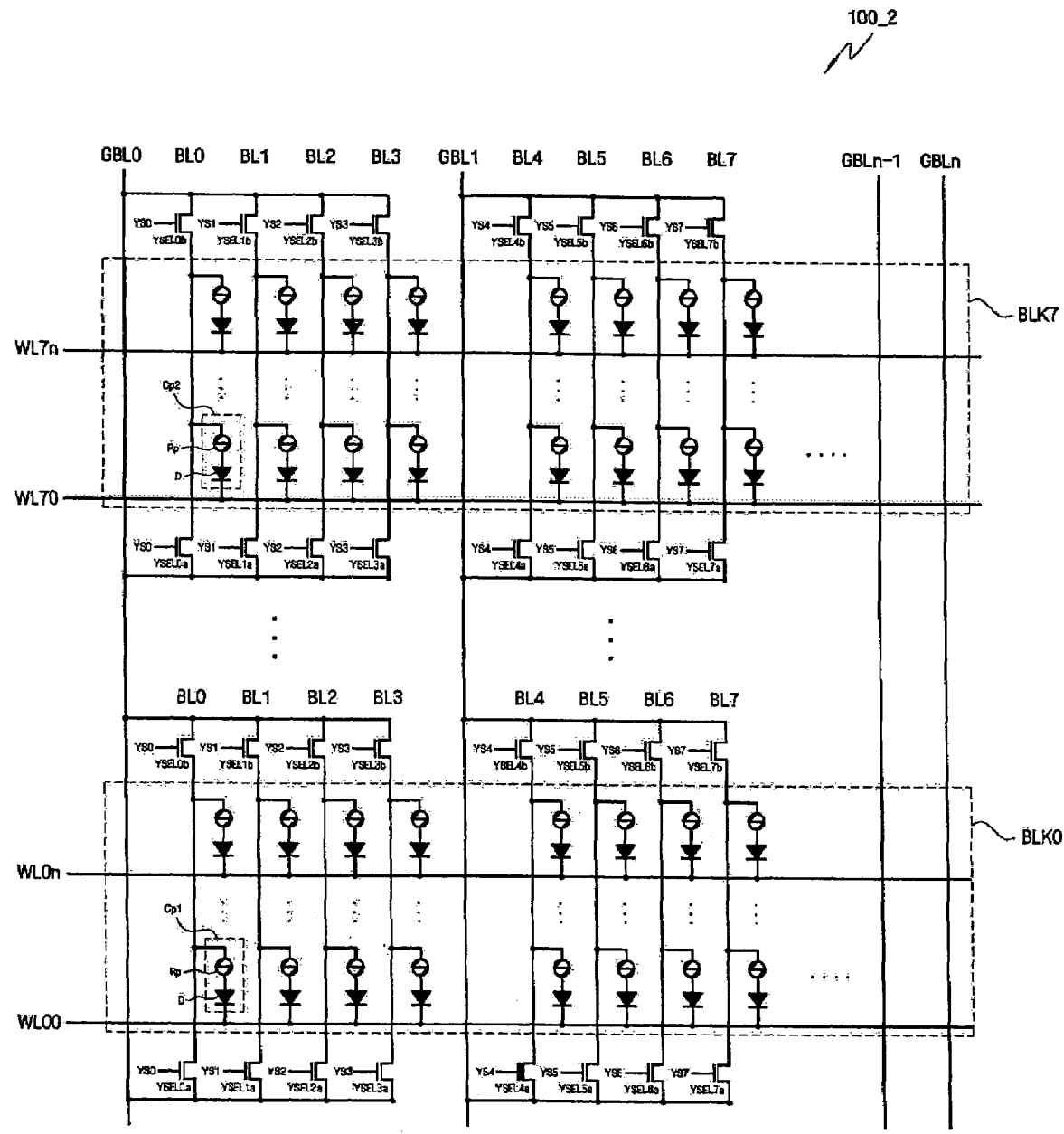

FIG. 2 is a circuit diagram illustrating an exemplary embodiment of a memory bank 100_2 of a phase change memory device. In FIG. 2, the second memory bank 100_2 is specifically shown for convenience of explanation, but it will be apparent to those skilled in the art that the same can be applied to the first, third, and fourth memory banks 100_1, 100_3, and 100_4, respectively.

Referring to FIG. 2, in an exemplary embodiment, the phase change memory device includes a plurality of memory blocks BLKi (where i=0 to 7), a plurality of local bit lines BLj (where j=0 to 7), a plurality of global bit lines GBLk (where k=0 to n), and a plurality of column selection transistors YSELja and YSELjb (where j=0 to 7).

The memory bank 100_2 includes a plurality of memory blocks BLKi (where i=0 to 7), and each of the memory blocks BLKi (where i=0 to 7) includes a plurality of phase change memory cells Cp1 and Cp2. Furthermore, the plurality of phase change memory cells Cp1 and Cp2 are located at intersections of word lines WL00, WL0$n$, WL70, and WL7$n$ and the bit lines. In particular, the bit lines can have a hierarchical bit line structure using a plurality of global bit lines GBLk (where k=0 to n) and a plurality of local bit lines BLj (where j=0 to 7). More specifically, the plurality of global bit lines GBLk (where k=0 to n) are coupled to the input/output circuit, and cross the plurality of memory blocks BLKi (where i=0 to 7). Furthermore, the plurality of local bit lines BLj (where j=0 to 7) are selectively coupled to each of the global bit lines GBLk (where k=0 to n) through the column selection transistors YSELja and YSELjb (where j=0 to 7). In addition, a plurality of phase change memory cells Cp1 and Cp2 are coupled to each of the local bit lines BLj (where j=0 to 7).

The resistance of the plurality of global bit lines GBLk (where k=0 to n) in an exemplary phase change memory device may be reduced as compared to a conventional phase change memory device. Moreover, if the resistance of the global bit line GBLk (where k=0 to n) is reduced, a write current and/or a read current to be applied to the phase change memory cells Cp1 and Cp2 can be can be made substantially uniform, regardless of the position of the phase change memory cell Cp1 or Cp2 (that is, regardless of a distance from the writing circuit and/or the reading circuit). In addition, the amount of the write current and/or the read current to be applied to the phase change memory cells Cp1 and Cp2 coupled to local bit lines BLj (where j=0 to 7) distant from the writing circuit and/or the reading circuit is increased as compared to a conventional phase change memory device. These features of an exemplary phase change device will be described in detail with reference to FIGS. 3 to 7.

Each of the phase change memory cells Cp1 and Cp2 includes a variable resistive element Rp. This element Rp includes a phase change material having a first resistance and a second resistance, i.e., two different resistances. One resistance corresponds to a crystalline state of the phase change material and the other resistance corresponds to an amorphous state of the phase change material. Each phase memory cell Cp1 and Cp2 also includes an access element D which controls a feedthrough current flowing in the variable resistive element Rp. The variable resistive element Rp is coupled between the local bit line BLj (where j=0 to 7) and the access element D. In an exemplary embodiment, a diode whose anode is coupled to the variable resistive element Rp and whose cathode is coupled to the word line WL00, WL0$n$, WL70, or WL7$n$ is used as the access element D. However, unlike FIG. 2, the positions of the variable resistive element Rp and the access element D can vary according to different embodiments without departing from the scope of the disclosure. Additionally, various materials such as, for example, materials including two elements, such as GaSb, InSb, InSe, or $Sb_2Te_3$, GeTe, materials including three elements, such as GeSbTe, GaSeTe, InSbTe, $SnSb_2Te_4$, or InSbGe, materials including four elements, such as AgInSbTe, (GeSn)SbTe, GeSb(SeTe), or $Te_{81}Ge_{15}Sb_2S_2$ can be used as the phase change material. Beneficially, GeSbTe containing germanium (Ge), stibium (Sb), and tellurium (Te) can be used as the phase change material.

The column selection transistors YSELja and YSELjb (where j=0 to 7) selectively couple the local bit lines BLj (where j=0 to 7) to the global bit line GBLk (where k=0 to n) in response to column selection signals YSi (where i=0 to 7). In an exemplary embodiment, the column selection transistors YSELja and YSELjb (where j=0 to 7) are coupled to both sides of each of the plurality of local bit lines BLj (where j=0 to 7), but the present disclosure is not limited to this configuration. That is, the column selection transistor may be coupled to one side of each of the plurality of local bit lines BLj (where j=0 to 7). Furthermore, in an exemplary embodiment, the column selection signal YSi (where i=0 to 7) may be a signal obtained by decoding the column address and block information.

Figure 3:
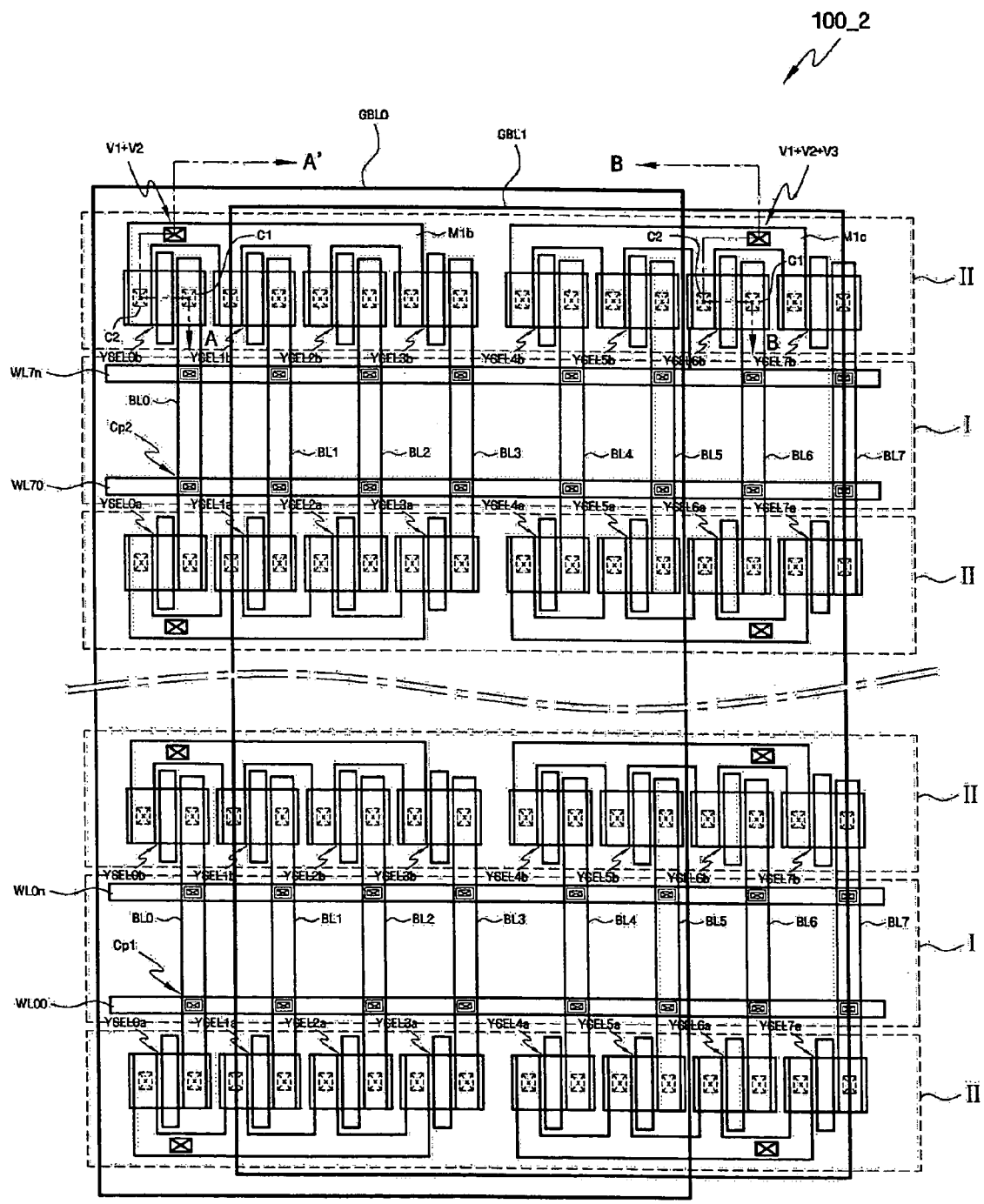
FIG. 3 is a layout view of a phase change memory device according to an exemplary disclosed embodiment.
Figure 4:
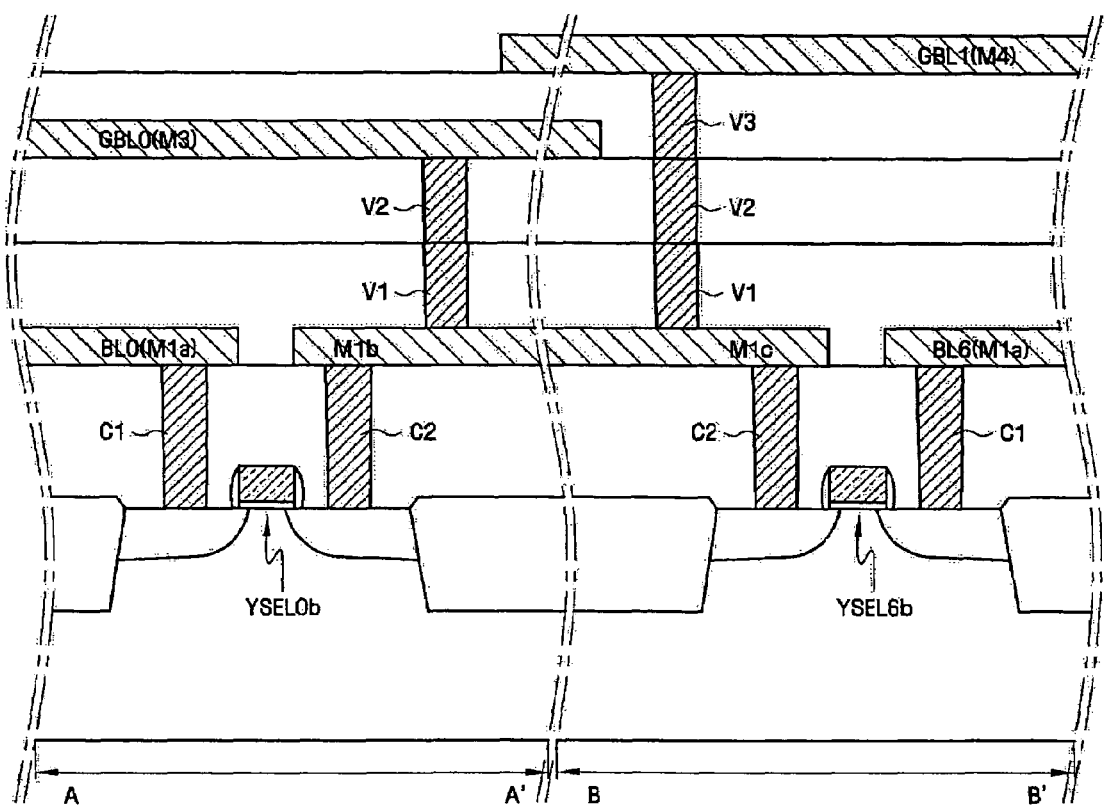
FIG. 4 is a cross-sectional view taken along the lines IVA-IVA and IVB-IVB of FIG. 3.
Figure 5A:
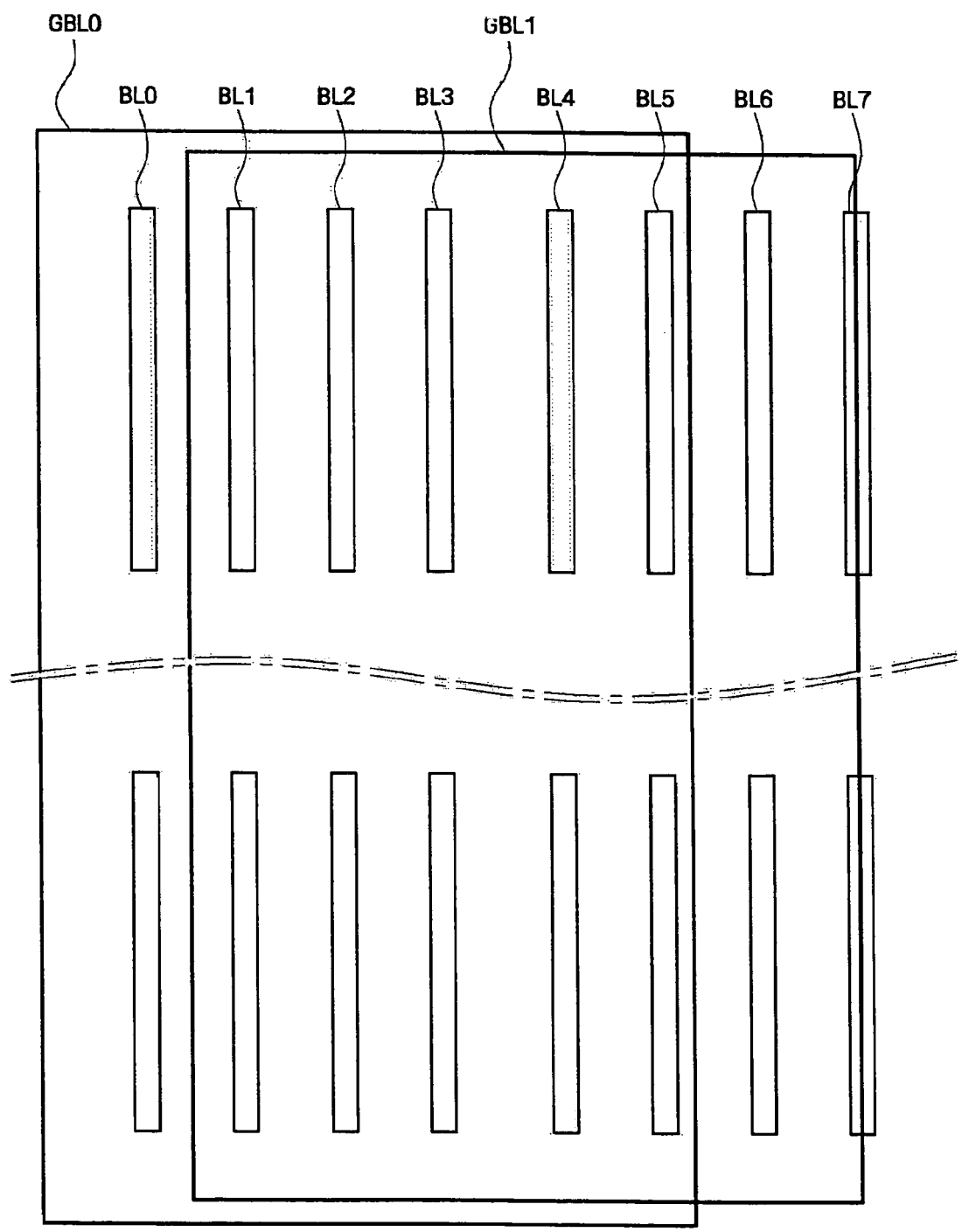
FIG. 5A and FIG. 5B are diagrams illustrating the arrangement relationship of global bit lines and local bit lines of a phase change memory device according to an exemplary disclosed embodiment.
Figure 5B:
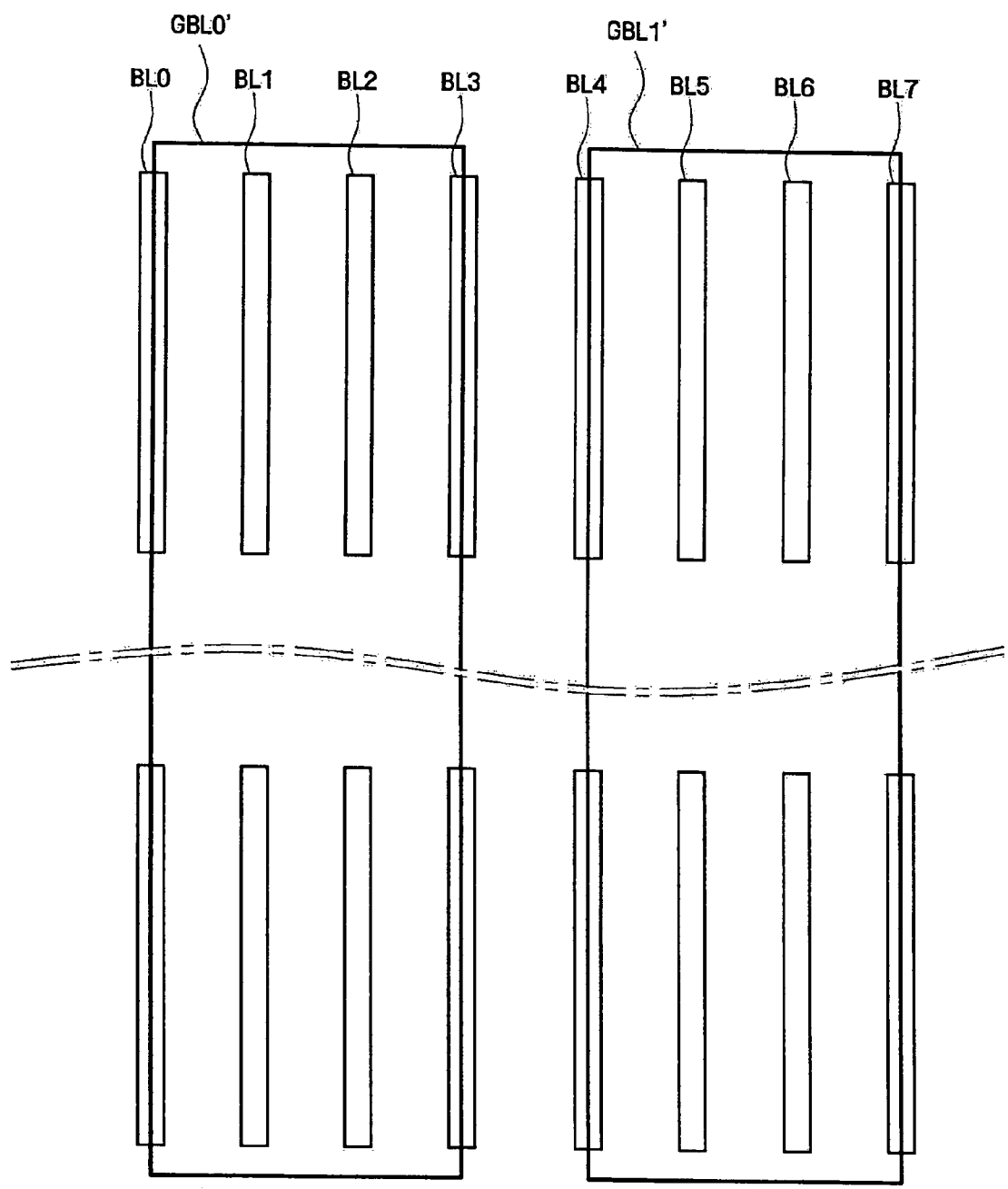

FIG. 3 is a layout view of an exemplary disclosed phase change memory device. Furthermore, FIG. 4 is a cross-sectional view taken along the lines VA-VA and VB-VB of FIG. 3. In addition, FIG. 5A and FIG. 5B are diagrams illustrating the arrangement relationship of global bit lines and local bit lines in an exemplary disclosed phase change memory device.

Referring to FIGS. 3 and 4, a plurality of phase change memory block regions I and a plurality of column selection region II are defined on a semiconductor substrate. In an exemplary embodiment, a case where the column selection regions II are arranged on both sides of the phase change memory block region I is illustrated, but the present disclosure is not limited to this configuration. For example, a column selection region II may be arranged on one side of the phase change memory block region I only without departing from the scope of the present disclosure.

Furthermore, a plurality of phase change memory cells Cp1 and Cp2 are formed on the phase change memory block region I. Specifically, the phase change memory cells Cp1 and Cp2 are formed at intersections of a plurality of the word lines WL00, WL0n, WL70, and WL7n that are formed to extend in a first direction, and the plurality of local bit lines BLj (where j=0 to 7) that are formed to extend in a second direction that is perpendicular to the word lines WL00, WL0n, WL70, and WL7n. In addition, a plurality of column selection transistors YSELja and YSELjb (where j=0 to 7) that selectively couple first and second global bit lines GBL0 and GBL1 to the plurality of local bit lines BLj (where j=0 to 7) are formed on the column selection region II.

The plurality of local bit lines BLj (where j=0 to 7) are formed to extend in the second direction on each of the phase change memory block regions I. In addition, the first and second global bit lines GBL0 and GBL1 are formed to extend in the second direction to cross the plurality of phase change memory block regions I. In particular, in an exemplary embodiment, the plurality of global bit lines GBL0 and GBL1 are formed at two or more wiring line levels. Specifically, in FIGS. 3 and 4, the first and second global bit lines GBL0 and GBL1 that are arranged adjacent to each other are formed at different wiring line levels.

Now, each of the wiring line levels will be described in detail. Referring to FIG. 4, at a first wiring line level, the local bit lines BLj (where j=0 to 7) that are individually connected to first contacts C1 formed on source nodes of the column selection transistors YSELja and YSELjb (where j=0 to 7), and metal wiring lines M1b and M1c that are commonly connected to a plurality of second contacts C2 formed on drain nodes of the plurality of column selection transistors YSELja and YSELjb (where j=0 to 7) are formed.

At a second wiring line level, a plurality of metal wiring lines that extend in the first direction and are coupled to the word lines WL00, WL0n, WL70, and WL7n can be formed. In this case, signals are simultaneously transmitted through the word lines WL00, WL0n, WL70, and WL7n and the metal wiring lines at the second wiring line level, and thus signal characteristics may be improved.

At a third wiring line level, the first global bit line GBL0 that is connected to a plurality of vias V1+V2 formed on the metal wiring line M1b at the first wiring line level is formed. Furthermore, at a fourth wiring line level, the second global bit line GBL1 that is connected to a plurality of vias V1+V2+V3 formed on the metal wiring line M1c at the first wiring line level is formed.

In an exemplary embodiment, a case where a plurality of vias V1, V2, and V3 are directly connected to one another is illustrated. However, a plurality of vias V1, V2, and V3 may also be connected to one another through separate pads formed among the vias V1, V2, and V3 without departing from the scope of the present disclosure.

Thus, the first global bit line GBL0 is coupled to the individual local bit lines BLj (where j=0 to 3) through the plurality of vias V1+V2, the metal wiring line M1b at the first wiring line level, the second contact C2, the column selection transistor YSEL0b, and the first contact C1. The second global bit line GBL1 is coupled to the individual local bit lines BLj (where j=4 to 7) through the plurality of vias V1+V2+V3, the metal wiring line M1c at the first wiring line level, the second contact C2, the column selection transistor YSEL7b, and the first contact C1.

Furthermore, in an exemplary embodiment, the resistance of the first and second global bit lines GBL0 and GBL1 may be lower than the resistance of the global bit lines in conventional phase change memory devices. Specifically, referring to FIG. 5A, the first and second global bit lines GBL0 and GBL1 are formed at different wiring line levels. Furthermore, one global bit line (for example, GBL0) is formed to cover some of the plurality of bit lines (for example, BLj (where j=4 to 7)) that are coupled to another global bit line (for example, GBL1). In contrast, referring to FIG. 5B, the global bit lines GBL0' and GBL1' of the conventional art are formed at the same wiring line level. Furthermore, the global bit line GBL0' or GBL1' is formed to cover at least some of the plurality of bit lines BLj (where j=0 to 3) or BLj (where j=4 to 7). However, there is no overlap between the global bit line GLB0' or GBL1' that are coupled the bit lines BLj (where j=0 to 7). Therefore, in an exemplary embodiment, because the area of the global bit line GBL0 or GBL1 is larger than the area of the global bit line GBL0' or GBL1' of the conventional art, the resistance of the global bit line GBL0 or GBL1 may be low.

The effects of the reduction in resistance of the global bit lines in the present disclosure will be now described with reference to FIGS. 6 and 7.

Figure 6:
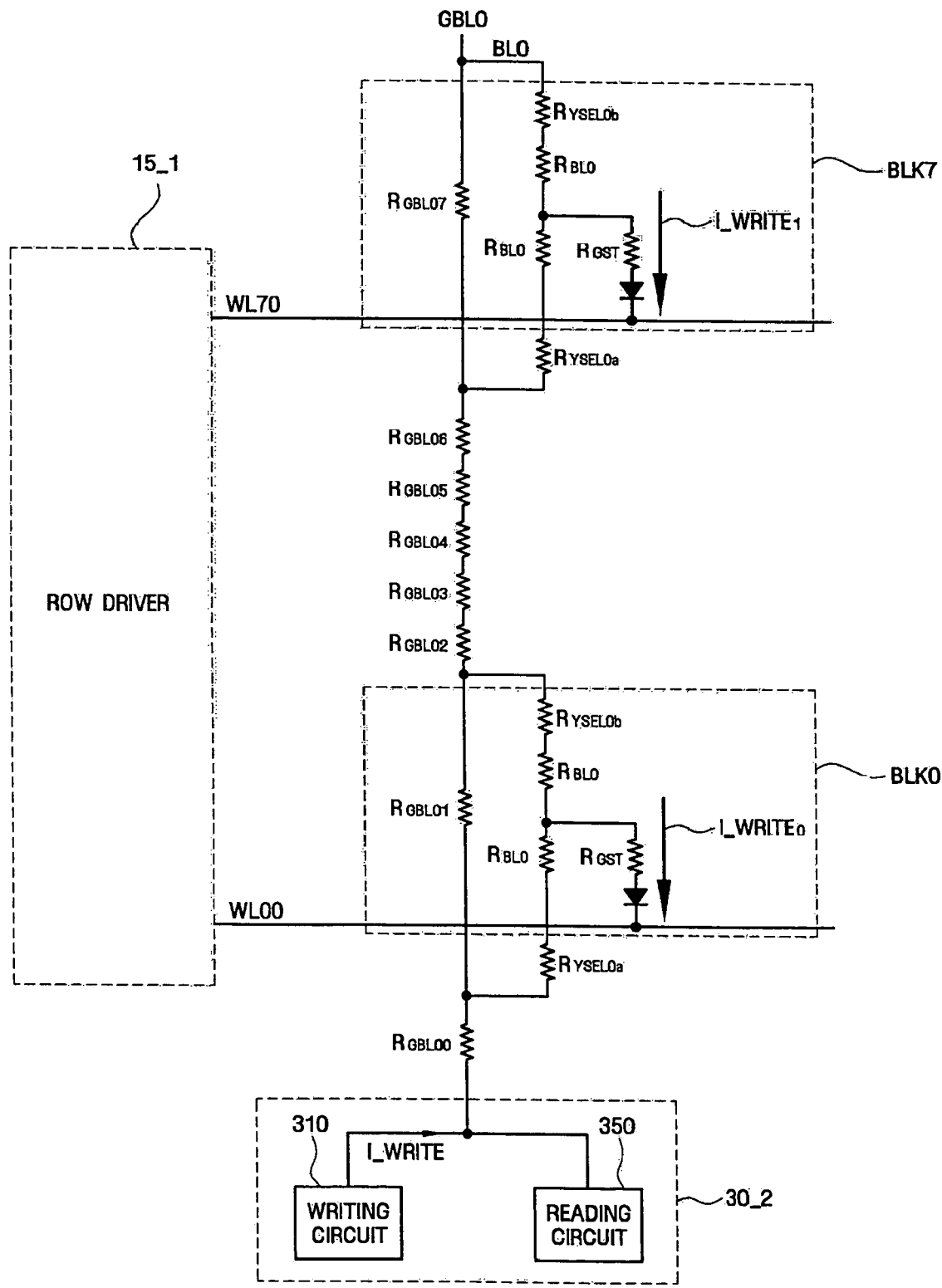
FIG. 6 is a circuit diagram illustrating a writing operation of a phase change memory device according to an exemplary disclosed embodiment.

FIG. 6 is a circuit diagram illustrating a reading operation in a phase change memory device according to an exemplary disclosed embodiment. FIG. 7 is a diagram illustrating conditions for causing a phase change of a phase change material of the phase change memory cell. In FIG. 6, for convenience of explanation, other memory blocks are not shown, and only the phase change memory cells of the first memory block BLK0 and the phase change memory cells of the eighth memory block BLK7 are shown. Furthermore, the resistance of the first global bit line GBL0 is shown on the first global bit line GBL0 by resistors. In addition, the column selection transistors and the variable resistive elements are shown by resistors, each resistor having a predetermined resistance.

Figure 7:
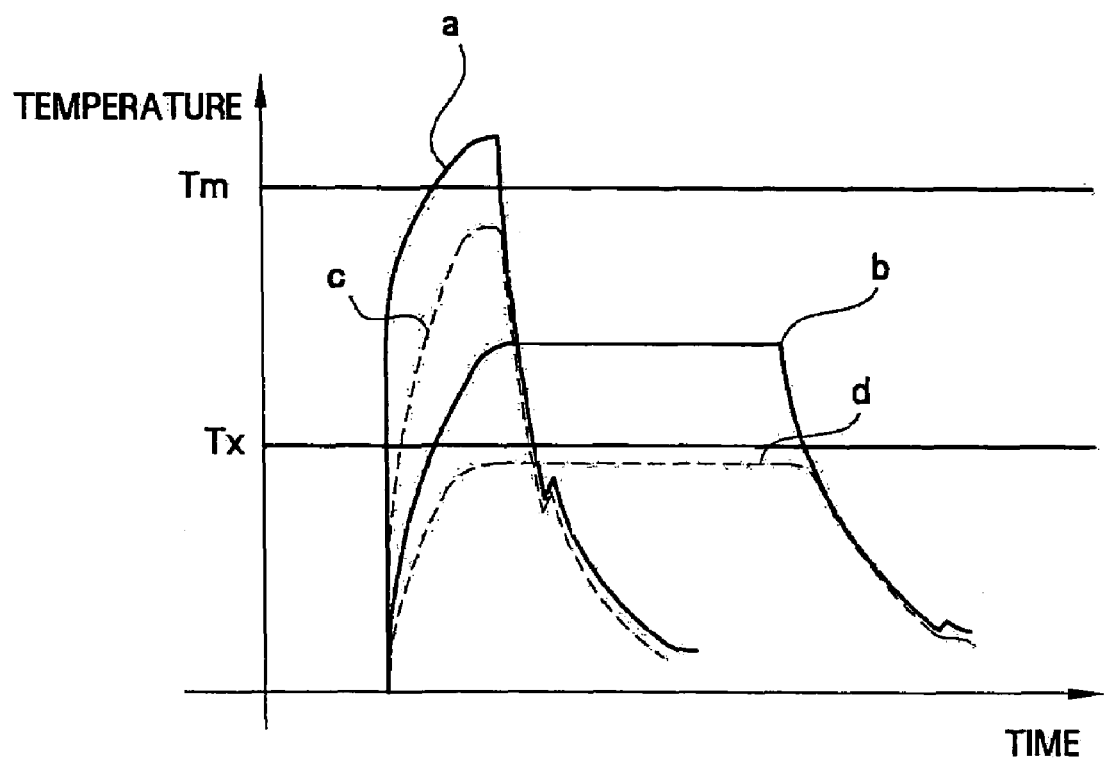
FIG. 7 is a diagram illustrating conditions for causing a phase change of a phase change material in a phase change memory cell.

Referring to FIGS. 6 and 7, if the word line WL00 or WL70 is selected by a row driver 15_1 and the local bit line BL0 is selected by a column decoder (not shown); the phase change memory cell Cp1 or Cp2 into which data is to be written is selected. In particular, when a diode is used as the access element, the selected word line WL00 or WL70 is at the low level, and the diode is turned on.

In an exemplary embodiment, data is written into the phase change memory cells Cp1 and Cp2 using Joule heat. This Joule heat is generated when a writing circuit 310 supplies a write current I_WRITE to the variable resistive element $R_{GST}$ including the phase change material. More specifically, the write current I_WRITE transforms the phase change material into an amorphous state of a logic level 1 by heating the phase change material to a melting temperature Tm or more and then rapidly cooling (see a in FIG. 7). Furthermore, the phase change material transforms into a crystalline state of a logic level 0 when heated to a temperature that is greater than a crystallization temperature Tx but less than the melting temperature Tm, when kept at this temperature for a predetermined time, and then by being cooled (see b in FIG. 7). Therefore, in order to cause a phase change of the phase change material, it may be beneficial to supply an accurate amount of the write current I_WRITE for a predetermined time. For example, the write current I_WRITE for the reset is about 1 mA and the write current I_WRITE for the set is about 0.6 to 0.7 mA.

Even though the writing circuit 310 supplies the prescribed write current I_WRITE in such a manner, erroneous data may be stored because the selected phase change memory cell Cp1 or Cp2 and the writing circuit 310 are spaced away from each other. This is because there is a difference in the physical length between the phase change memory cell Cp1 in the first memory block BLK0 that is close to the writing circuit 310 and the phase change memory cell Cp2 in the eighth memory block BLK7 that is comparatively distant from the writing circuit 310.

More specifically, because there is resistance in the global bit line GBL0, resistance from the writing circuit 30_2 to the phase change memory cell Cp1 or Cp2 is not uniform. This difference in resistance is because of the difference in the physical distance between the writing circuit 30_2 and the phase change memory cells Cp1 and Cp2.

As viewed from the perspective of the writing circuit 310, the resistance from the writing circuit 310 to the phase change memory cell Cp1 in the first memory block BLK0 becomes $R_{GBL00}+R_{YSEL0a}+R_{BL0}$ or $R_{GBL00}+R_{GBL01}+R_{YSEL0b}+R_{BL0}$. Furthermore, the resistance from the writing circuit 310 to the phase change memory cell Cp2 in the eighth memory block BLK7 becomes $$\left(\sum_{j=0}^{6} R_{GBL0j}\right) + R_{YSEL0a} + R_{BL0} \text{ or } \left(\sum_{j=0}^{7} R_{GBL0j}\right) + R_{YSEL0b} + R_{BL0}.$$

In this case, $R_{GBL00}$ to $R_{GBL07}$ represent the resistance of the global bit line GBL0, $R_{YSEL0a}$ and $R_{YSEL0b}$ represent resistance of the column selection transistors YSEL0a and YSEL0b, respectively. In addition, $R_{GST}$ represents the resistance of the phase change material of the variable resistive element.

Because of this difference in resistance between the write circuit 310 and the phase change memory cells Cp1 and Cp2, the write current I_WRITE$_0$ and the write current I_WRITE$_1$ that are fed through the phase change memory cells Cp1 and Cp2 in the first and eighth memory block BLK0 and BLK7, respectively, are different. In particular, the level of the write current I_WRITE$_1$ of the phase change memory cells Cp1 and Cp2 that are distant from the writing circuit 310 becomes smaller than the level of the write current I_WRITE$_0$ of the phase change memory cells Cp1 and Cp2 that are close to the wiring circuit 310.

As described above, a method of writing data into the phase change memory cells Cp1 and Cp2 uses Joule heat that is generated when the write current I_WRITE$_0$ or I_WRITE$_1$ is supplied to the variable resistive element including the phase change material. In this case, Joule heat is proportional to a square of the write current I_WRITE$_0$ or I_WRITE$_1$. Therefore, if the current level of the write current I_WRITE$_1$ that is to be supplied to the phase change memory cell Cp2 that is distant from the writing circuit 310 is small, Joule heat sufficient for writing data may not be generated. Furthermore, because the temperature of the phase change memory cell Cp1 or Cp2 is proportional to Joule heat, a change in temperature of the phase change memory cell Cp2 that is distant from the writing circuit 310 is as shown in c and d of FIG. 7. That is, as shown in FIG. 7, because the temperature needed for a proper phase change is not attained, an erroneous operation may occur. Specifically, a logic level corresponding to input data is not stored in the phase change memory cell Cp2 that is distant from the writing circuit 310. In particular, when the phase change memory cells Cp1 and Cp2 distant from the writing circuit 310 are in the reset state, resistance of $R_{GST}$ is large. This large resistance of $R_{GST}$ may prevent a proper writing operation in the distant memory cells.

In contrast, in an exemplary embodiment, the resistance of the global bit line GBL0 or GBL1 is reduced. Moreover, the current level of the write current of the phase change memory cell Cp2 that is distant from the writing circuit 310 and the current level of the write current of the phase change memory cell Cp1 that is close to the writing circuit 310 can be made substantially uniform. Furthermore, the current level of the write current of the phase change memory cell Cp2 distant from the writing circuit 310 can be made large compared to the conventional art. Therefore, the probability of an erroneous writing operation can be reduced.

In FIGS. 6 and 7, the effect of preventing the erroneous reading operation of the phase change memory cells Cp1 and Cp2 in an exemplary disclosed embodiment has been described. However, one skilled in the art will appreciate that using the same or similar configuration, an effect of preventing an erroneous writing operation can also be obtained without departing from the scope of the present disclosure.

Figure 8:
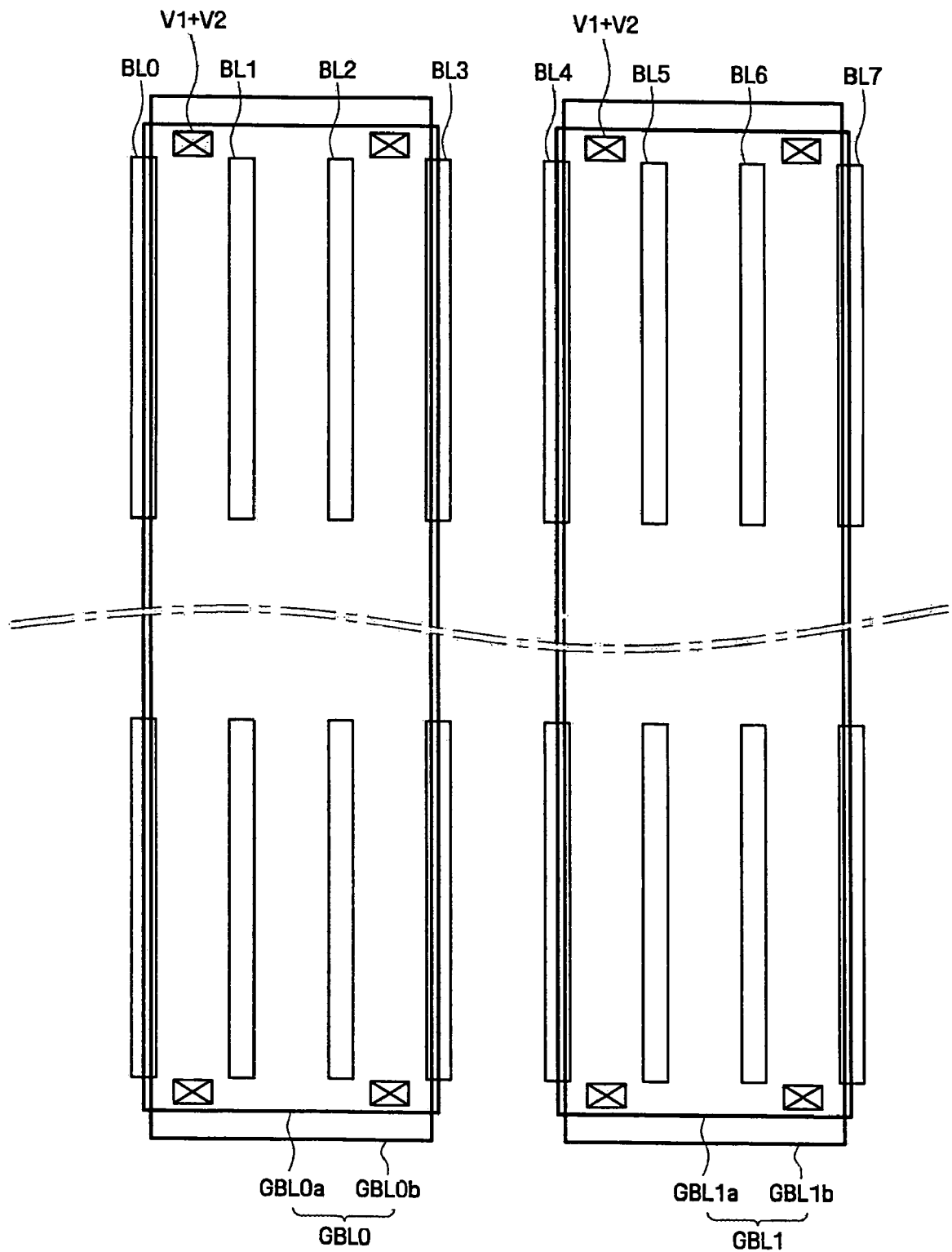
FIG. 8 is a diagram illustrating the arrangement relationship of global bit lines and local bit lines of a phase change memory device according to an alternative exemplary disclosed embodiment.

FIG. 8 is a diagram illustrating the arrangement relationship of global bit lines and local bit lines of a phase change memory device according to an alternative exemplary embodiment. The same parts as those in FIGS. 3 and 5A are represented by the same reference numerals, and the descriptions thereof will be omitted.

Referring to FIG. 8, a phase change memory device according to an exemplary embodiment has a plurality of global bit lines GBL0 and GBL1 that are formed at two or more wiring line levels. Furthermore, the global bit line GBL0 or GBL1 has a plurality of coupled metal wiring lines GBL0a and GBL0b or GBL1a and GBL1b. Specifically, the first global bit line GBL0 includes the metal wiring lines GBL0a and GBL0b that are formed at the third and fourth wiring line levels. In addition, the metal wiring lines GBL0a and GBL0b can be connected to each other through vias V1+V2. Similarly, the second global bit line GBL1 also includes the metal wiring lines GBL1a and GBL1b that are formed at the third and fourth wiring line levels, and the metal wiring lines GBL1a and GBL1b can be connected to each other through a plurality of vias V1+V2.

In this configuration, because the area of the first and second global bit lines GBL0 or GBL1 becomes wide, resistance of the first and second global bit line GBL0 or GBL1 is reduced.

In another exemplary embodiment, a case where the first and second global bit lines GBL0 and GBL1 are formed at the two wiring line levels is illustrated, but the present disclosure is not limited to this configuration. That is, the global bit lines may be formed at three or more wiring line levels.

Although the present invention has been described in connection with the exemplary embodiments of the present invention, it will be apparent to those skilled in the art that various modifications and changes may be made thereto without departing from the scope and spirit of the invention. Therefore, it should be understood that the above embodiments are not limitative, but illustrative in all aspects.

What is claimed is:

1. A phase change memory device comprising:
a semiconductor substrate which includes a plurality of phase change memory cells;
a plurality of local bit lines extending over the semiconductor substrate, each of the plurality of local bit lines being coupled to the plurality of phase change memory cells; and
a plurality of global bit lines extending over the plurality of local bit lines, each of the plurality of global bit lines being selectively coupled to the plurality of local bit lines,
wherein the plurality of global bit lines are located at two or more different wiring line levels over the semiconductor substrate.

2. The phase change memory device of claim 1, wherein the plurality of global bit lines include adjacent first and second global bit lines formed of respective first and second metal wiring lines located at different wiring line levels over the semiconductor substrate.

3. The phase change memory device of claim 2, wherein the first global bit line overlaps one or more of the plurality of local bit lines coupled to the second global bit line.

4. The phase change memory device of claim 2, wherein the first and second metal wirings partially overlap one another.

5. The phase change memory device of claim 1, wherein the local bit lines extend lengthwise in a first direction.

6. The phase change memory device of claim 1, wherein each of the plurality of global bit lines is formed of a plurality of metal wiring lines that are formed at two or more wiring line levels and are coupled to each other.

7. The phase change memory device of claim 1, wherein each of the plurality of phase change memory cells includes a variable resistive element that includes a phase change material having at least two resistance values in response to a feedthrough current, and an access element controlling the feedthrough current.

8. The phase change memory device of claim 7, wherein the access element is a diode coupled in series to the variable resistive element.

9. The phase change memory device of claim 7, wherein the phase change material includes germanium (Ge), stibium (Sb), and tellurium (Te).

10. A phase change memory device comprising:
a semiconductor substrate including a plurality of phase change memory block regions and a plurality of column selection regions;
a plurality of phase change memory cells formed in each of the plurality of phase change memory block regions;
a plurality of local bit lines extending over the plurality of phase change memory block regions, each of the plurality of local bit lines being coupled to the plurality of phase change memory cells;
adjacent first and second global bit lines extending in a direction to cross over the plurality of phase change memory block regions; and
a plurality of column selection transistors formed on each of the plurality of column selection regions, each of the plurality of column selection transistors coupled between each of the plurality of local bit lines and the first or second global bit line,
wherein the first and second global bit lines are located at different wiring line levels over the semiconductor substrate.

11. The phase change memory device of claim 10, wherein the first global bit line overlaps one or more of the plurality of local bit lines coupled to the second global bit line.

12. The phase change memory device of claim 10, wherein nodes of the column selection transistors coupled to the first global bit line are commonly coupled through a first metal wiring line, and nodes of the column selection transistors coupled to the second global bit line are commonly coupled through a second metal wiring line.

13. The phase change memory device of claim 12, wherein the first and second global bit lines are coupled to the first and second metal wiring lines through a plurality of vias, respectively.

14. The phase change memory device of claim 10, wherein the first and second global bit lines partially overlap one another.

15. A phase change memory device comprising:
a semiconductor substrate including a plurality of phase change memory block regions and a plurality of column selection regions;
a plurality of phase change memory cells formed in each of the plurality of phase change memory block regions;
a plurality of local bit lines extending over the plurality of phase change memory block regions, each of the plurality of local bit lines being coupled to the plurality of phase change memory cells;
a plurality of global bit lines including a first and second global bit line extending in a direction to cross over the plurality of phase change memory block regions; and
a plurality of column selection transistors formed in each of the plurality of column selection regions, each of the plurality of column selection transistors being coupled between each of the plurality of local bit lines and the first or second global bit line,
wherein each of the plurality of global bit lines is formed of a plurality of metal wiring lines that are formed at two or more wiring line levels and are coupled to each other.

16. The phase change memory device of claim 15, wherein nodes of the column selection transistors coupled to each of the plurality of global bit lines are commonly coupled through a first metal wiring line.

17. The phase change memory device of claim 16, wherein each of the plurality of global bit lines is coupled to the first metal wiring line through a plurality of vias.

* * * * *